United States Patent
Cohen et al.

(10) Patent No.: US 9,059,552 B2
(45) Date of Patent: Jun. 16, 2015

(54) LAND GRID ARRAY (LGA) SOCKET CARTRIDGE AND METHOD OF FORMING

(71) Applicant: International Business Machines Corporation, Armonk, NY (US)

(72) Inventors: Erwin B. Cohen, South Burlington, VT (US); Mark C. H. Lamorey, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 13/745,965

(22) Filed: Jan. 21, 2013

(65) Prior Publication Data

US 2014/0206206 A1    Jul. 24, 2014

(51) Int. Cl.
| | | |
|---|---|---|
| H01R 12/00 | (2006.01) | |
| H01R 43/00 | (2006.01) | |
| H01R 12/71 | (2011.01) | |
| H05K 3/34 | (2006.01) | |

(52) U.S. Cl.
CPC ........... *H01R 43/00* (2013.01); *Y10T 29/49124* (2015.01); *H01R 12/714* (2013.01); *H05K 3/3436* (2013.01); *H05K 2201/10325* (2013.01)

(58) Field of Classification Search
CPC .............................. H01R 23/722; H01R 23/725
USPC ........... 439/66, 74, 76.1, 79, 82, 75, 324, 248
See application file for complete search history.

(56) References Cited

U.S. PATENT DOCUMENTS

| | | | |
|---|---|---|---|
| 4,548,451 A * | 10/1985 | Benarr et al. ................... | 439/85 |
| 5,746,927 A | 5/1998 | Hashimoto et al. | |
| 5,779,492 A | 7/1998 | Okuyama et al. | |
| 6,728,133 B2 | 4/2004 | Shimizu | |
| 6,759,610 B1 * | 7/2004 | Dove et al. .................... | 200/182 |
| 7,163,830 B2 | 1/2007 | Salmon et al. | |
| 7,939,945 B2 | 5/2011 | Sauciuc et al. | |
| 8,137,113 B2 * | 3/2012 | Ouchi et al. .................... | 439/66 |
| 8,174,279 B2 | 5/2012 | Lee et al. | |
| 2003/0071246 A1 | 4/2003 | Grigorov et al. | |
| 2005/0061474 A1 | 3/2005 | Gelorme et al. | |
| 2007/0045766 A1 | 3/2007 | Ho | |
| 2007/0222070 A1 | 9/2007 | Maruyama et al. | |
| 2008/0308303 A1 | 12/2008 | Lehmann et al. | |
| 2011/0043234 A1 * | 2/2011 | Lee et al. ................. | 324/755.09 |

FOREIGN PATENT DOCUMENTS

CN        102237588 A    11/2011

* cited by examiner

*Primary Examiner* — Phuongchi T Nguyen

(74) *Attorney, Agent, or Firm* — David A. Cain; Hoffman Warnick LLC

(57) ABSTRACT

Aspects of the present invention relate to land grid array socket cartridge structures. In one embodiment, a land grid array (LGA) cartridge structure includes: a deformable thin film having at least one aperture configured to hold a substantially liquid metal, whereby in a compressed state of the deformable thin film, the substantially liquid metal of the deformable thin film is configured to electro-mechanically couple a carrier and a socket base. Another embodiment includes a method of forming a LGA cartridge structure. The method includes: providing a deformable thin film having a first surface and a second surface, and forming at least one aperture within the deformable thin film through the first surface and the second surface, wherein the aperture is configured to hold a substantially liquid metal.

10 Claims, 7 Drawing Sheets

LAND GRID ARRAY (LGA) SOCKET CARTRIDGE AND METHOD OF FORMING

BACKGROUND

1. Technical Field

The subject matter disclosed herein relates generally to land grid array (LGA) structures. Specifically, the subject matter disclosed herein relates to LGA socket cartridge structures and a method of forming.

2. Related Art

Conventional land grid array (LGA) socket structures are used in integrated circuits (IC) to electrically connect microchips to circuit boards. Typically, conventional LGA socket structures include a socket base electrically coupled to the circuit board, a carrier plate including the microchip, and a socket pressure plate for applying a force to the carrier plate to electro-mechanically connect the carrier plate and microchip to the circuit board via the socket base. Electrical connection components are formed on the socket base and the carrier plate for electro-mechanically connecting the microchip to the circuit board. Conventional electrical connection components formed on the socket base typically include solder or pogo pins. The use of solder for electro-mechanically connecting the carrier plate to the socket base forms a strong electrical connection. However, the connection formed by the solder is substantially permanent and has limited re-work capability of the LGA socket structure once the solder electro-mechanically connects the socket base and the carrier plate. The use of pogo pins in electro-mechanically connecting the socket base and the carrier plate allows for increased re-work capability of the LGA socket structure, as the electrical connection between the socket base and the carrier plate is not permanent. More specifically, the pogo pins include a spring within each pin, such that when carrier plate is compressed on to the socket base, the pogo pins are also compressed and form an electrical connection component for the socket base. However, the springs in the pogo pins for the socket base have a specific resistance and/or can warp due to constant compression. This can cause the pogo pins to have a reduced electrical conductivity operational life. Additionally, because of the intricate design of the pogo pins, manufacturing the pogo pins for the socket base can be very expensive.

BRIEF SUMMARY

Land grid array socket cartridge structures and methods of forming are disclosed. In one embodiment, a land grid array (LGA) cartridge structure includes: a deformable thin film having at least one aperture configured to hold a substantially liquid metal, whereby in a compressed state of the deformable thin film, the substantially liquid metal of the deformable thin film is configured to electro-mechanically couple a carrier and a socket base.

A first aspect of the invention includes a land grid array (LGA) cartridge structure having: a deformable thin film having at least one aperture configured to hold a substantially liquid metal, whereby in a compressed state of the deformable thin film, the substantially liquid metal of the deformable thin film is configured to electro-mechanically couple a carrier and a socket base.

A second aspect of the invention includes a land grid array (LGA) socket structure including: a socket base including a first set of LGA contacts on a first surface of the socket base; an LGA cartridge positioned over the first surface of the socket base, the LGA cartridge including a deformable thin film having at least one aperture configured to hold a substantially liquid metal; a carrier positioned over the deformable thin film of the LGA cartridge, the carrier including a second set of LGA contacts on a first surface of the carrier; and a socket pressure plate positioned over the carrier, the socket pressure plate configured to compress the LGA cartridge between the socket base and the carrier and electro-mechanically couple the carrier and the socket base using the substantially liquid metal during a compressed state of the LGA cartridge.

A third aspect of the invention includes a method of forming a land grid array (LGA) cartridge structure. The method includes: providing a deformable thin film having a first surface and a second surface; and forming at least one aperture within the deformable thin film through the first surface and the second surface, wherein the aperture is configured to hold a substantially liquid metal.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
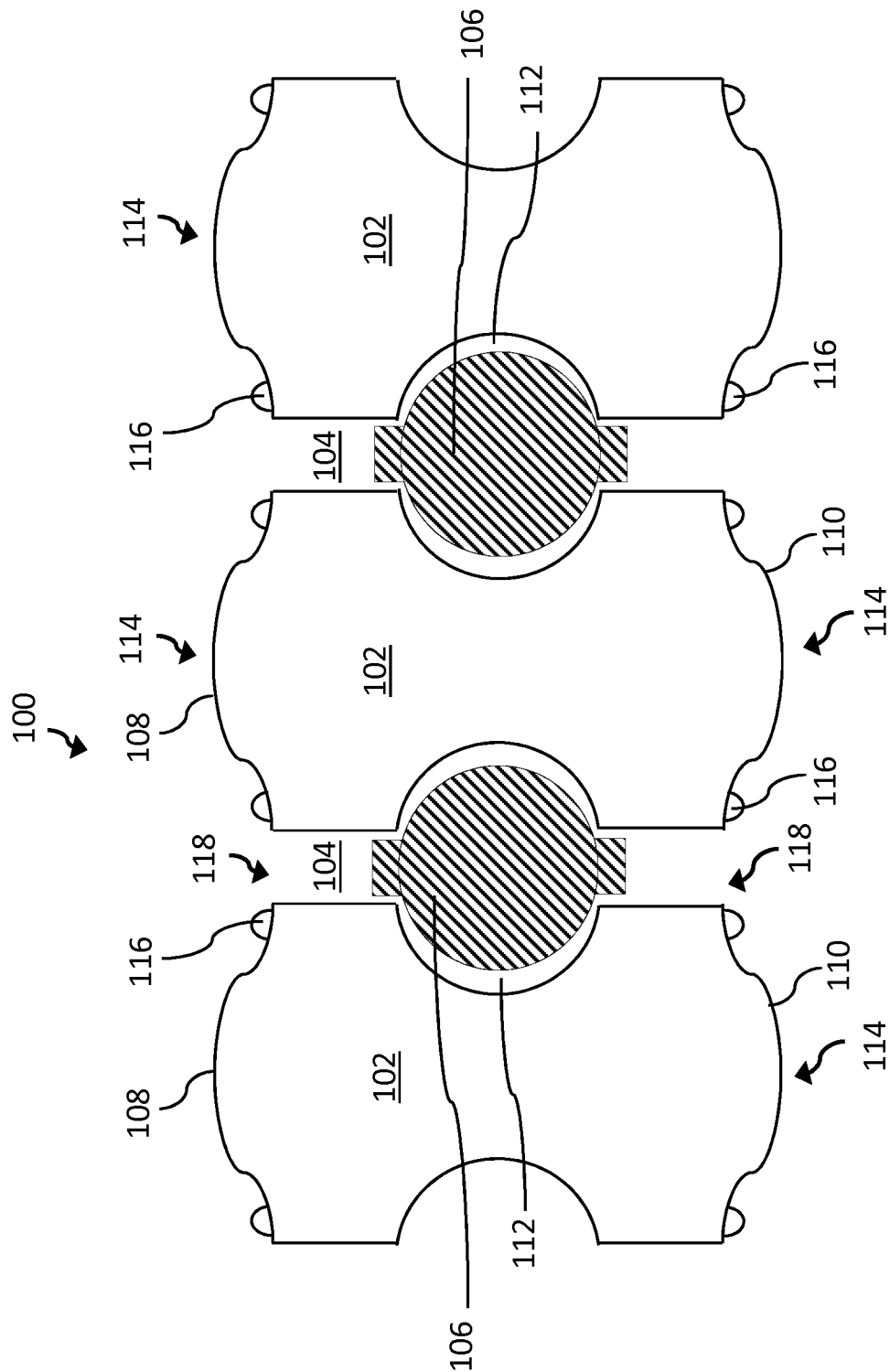
FIG. 1 shows a cross-sectional front view of a portion of a land grid array (LGA) cartridge structure in an uncompressed state, according to embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to land grid array (LGA) structures. Specifically, as described herein, aspects of the invention relate to LGA socket cartridge structures and a method of forming.

Figure 2:
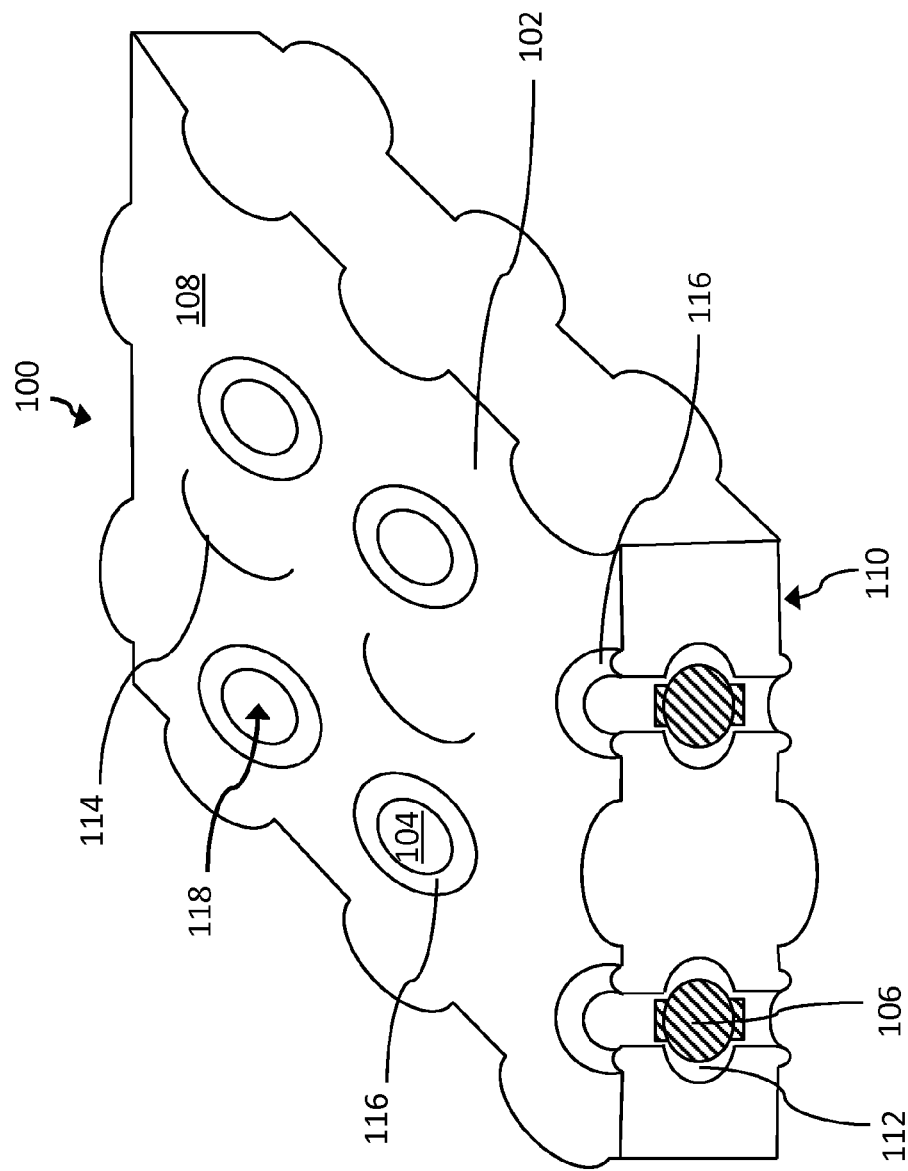
FIG. 2 shows a perspective view of a portion of the LGA cartridge structure in the uncompressed state as shown in FIG. 1, according to embodiments of the invention.
Figure 5:
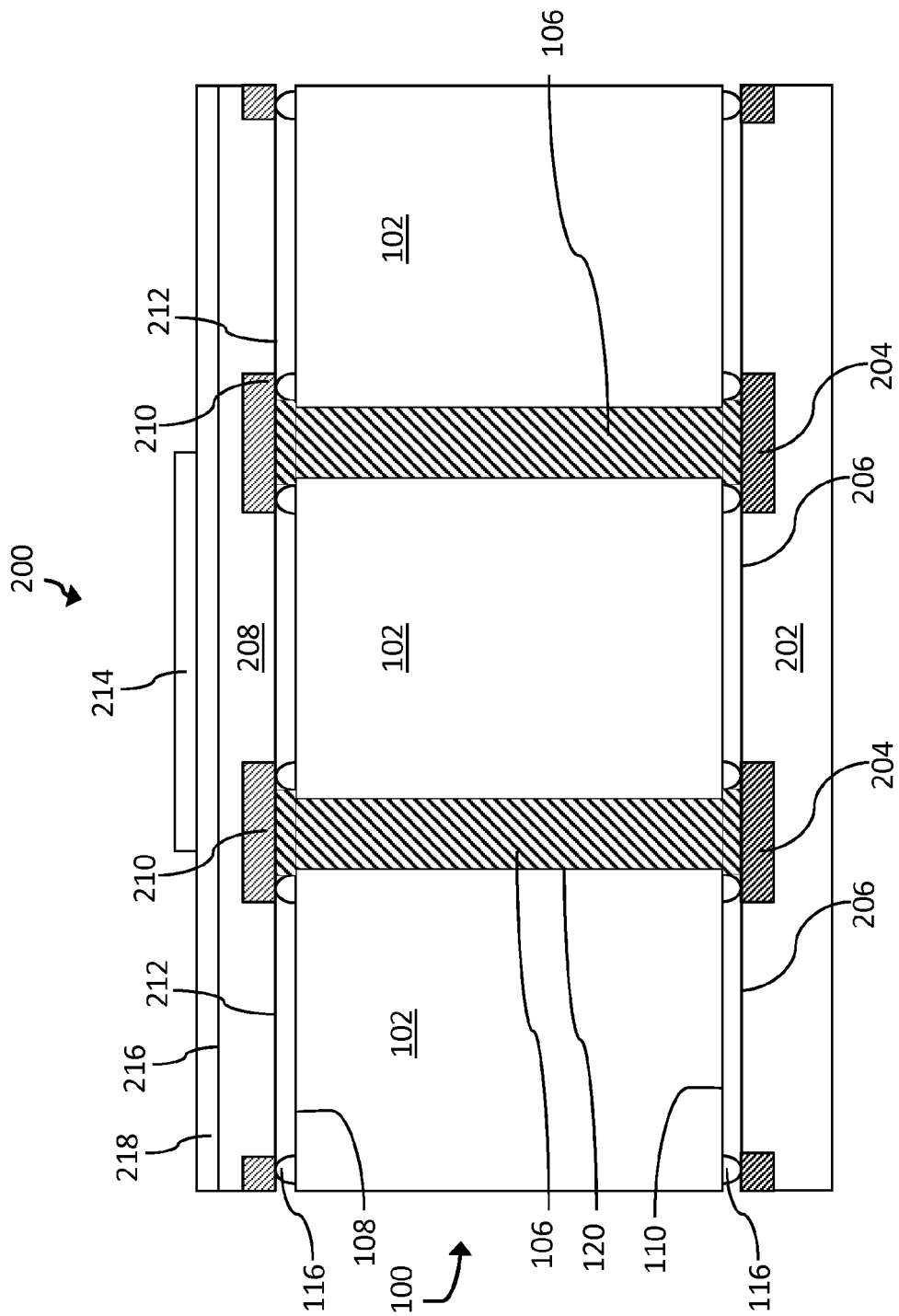
FIG. 5 shows a cross-sectional view of a portion of a LGA socket structure in a compressed state, according to embodiments of the invention.
Figure 6:
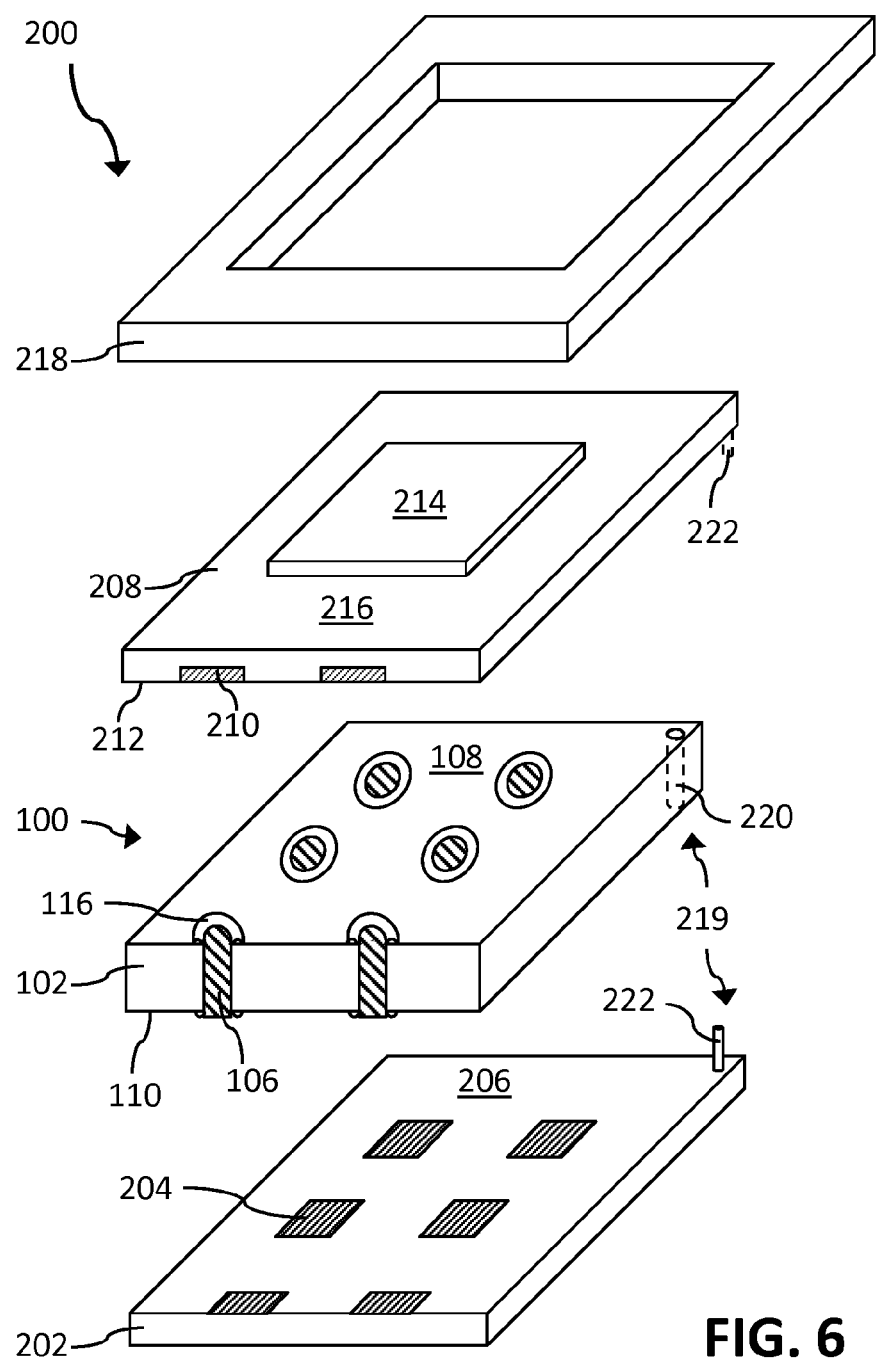
FIG. 6 shows an exploded perspective view of a portion of a LGA socket structure in a compressed state, according to embodiments of the invention.

Turning to FIGS. 1 and 2, a portion of a land grid array (LGA) cartridge structure is shown in an uncompressed state according to embodiments of the invention. An uncompressed state may occur when LGA cartridge structure 100 does not have a force applied to any surface of LGA cartridge structure 100. In contrast, and discussed herein, a compressed state may occur when LGA cartridge structure 100 does include a force being applied to at least one surface of LGA cartridge structure 100. As shown in FIG. 1, LGA cartridge structure 100 may include a deformable thin film 102 having at least one aperture 104 configured to hold a substantially liquid metal 106. Substantially liquid metal 106 may be in a liquid state during a compressed state and/or when LGA cartridge structure 100 is being implemented within an LGA socket, as discussed herein. Alternatively, when LGA cartridge structure 100 is not being implemented within LGA socket (e.g., during shipping) substantially liquid metal 106 may be in a substantially solid state or may be in a substantially liquid state. As discussed herein, in a compressed state of deformable thin film 102, substantially liquid metal 106 of deformable thin film 102 is configured to electro-mechanically couple a carrier and a socket base (FIGS. 5 and 6). Deformable thin film 102 of LGA cartridge structure 100 may include any conventional plastic, polymer or synthetic material capable of being deformed when a force is applied to a surface of the material. More specifically, deformable thin film 102 may include a plastic configured to substantially deform when a pressure is applied to a first surface 108 and a second surface 110. As discussed herein, the at least one aperture 104 may be formed in deformable thin film 102 by any conventional material removal technique including, but not limited to, drilling, milling, or electrical discharge machining (EDM).

In various embodiments, as shown in FIGS. 1 and 2, the at least one aperture 104 may also include an enlarged portion 112 configured to hold the substantially liquid metal 106 in the uncompressed state of deformable thin film 102 of LGA cartridge structure 100. More specifically, as shown in FIGS. 1 and 2, enlarged portion 112 may be formed within each of the at least one apertures 104 substantially between first surface 108 and second surface 110 for holding substantially liquid metal 106 within the at least one apertures 104 during an uncompressed state. As a result, enlarged portion 112 may substantially prevent substantially liquid metal 106 from leaking from the at least one apertures 106 of deformable thin film 102. Additionally, enlarged portion 112 may also provide space within the at least one aperture 104 for holding a predetermined amount of substantially liquid metal 106 to achieve an electro-mechanical coupling between a carrier and socket base (FIGS. 5 and 6) during a compressed state of deformable thin film 102, as discussed herein. As shown in FIGS. 1 and 2, and discussed herein, enlarged portion 112 may be formed by any conventional material removal technique including, but not limited to, drilling, milling, or electrical discharge machining (EDM).

Also shown in FIGS. 1 and 2, first surface 108 and second surface 110 of deformable thin film 102 includes a plurality of raised areas 114 positioned adjacent the at least one aperture 104 in an uncompressed state (e.g., FIGS. 1 and 2) of deformable thin film 102. As shown in FIGS. 1 and 2, raised areas 114 may include a plurality of "bumps" or protrusions formed on first surface 108 and second surface 110 of deformable thin film 102. As such, the plurality of raised areas 114 may include a similar material make up as deformable thin film 102, and may also include similar physical characteristics (e.g., deformation) as deformable thing film 102. The plurality of raised areas may be formed on first surface 108 and second surface 110 by any conventional mechanical formation technique, including, but not limited to, casting, injection molding, milling, etc.

LGA cartridge structure 100 may also include at least one substantially rigid structure 116 surrounding the at least one aperture 104 of deformable thin film 102. More specifically, as shown in FIGS. 1 and 2, substantially rigid structure 116 may surround each of the at least one aperture 104 and substantially rigid structure 116 may be formed on at least one surface (e.g., first surface 108, second surface 110) of deformable thin film 102. As shown in FIGS. 1 and 2, substantially rigid structure 116 may surround each of the at least one apertures 104 on both first surface 108 and second surface 110 of deformable thin film 102. As discussed herein, substantially rigid structures 116 may substantially prevent an amount of substantially liquid metal 106 from flowing out of an opening 118 of the at least one aperture 104 in which substantially rigid structure 116 surrounds during a compressed state of deformable thin film 102. Substantially rigid structure 116 may include a substantially durable material having minimal to no deformation characteristics. That is, substantially rigid structure 116 may include a material, for example, plastic or polymer, that is substantially stiffer then the material of deformable thin film 102, such that during a compressed state of deformable thin film 102, substantially rigid structure 116 maintains its shape and/or is not deformed. As discussed herein, substantially rigid structure 116 may be formed on deformable thin film 102 by any conventional mechanical coupling technique including, but not limited to, welding, mechanical fastening, or adhesion. In alternative embodiment, not shown, substantially rigid structure 116 may be formed or cast (e.g., injection molded) as a single component with deformable thin film 102.

Figure 3:
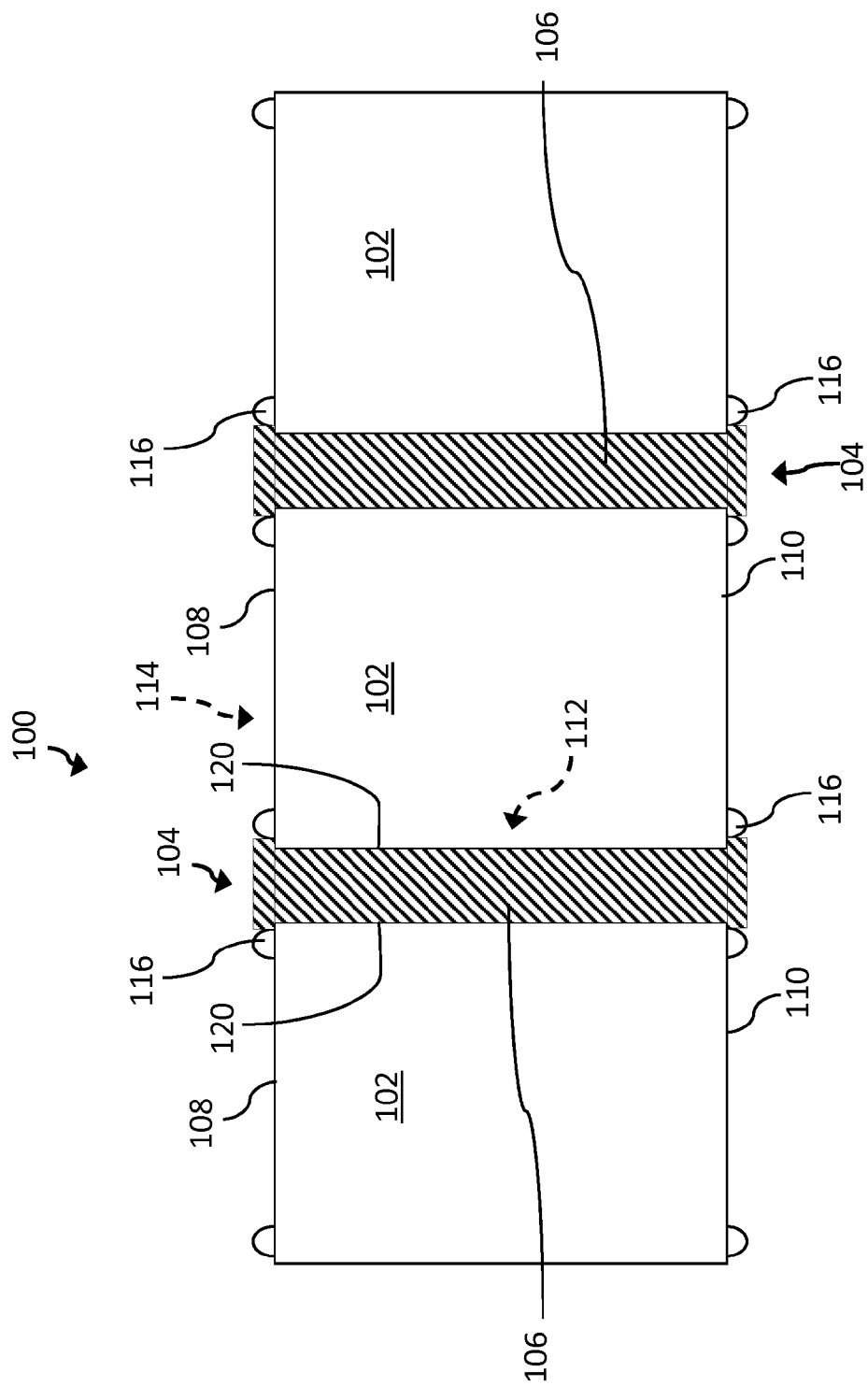
FIG. 3 shows a cross-sectional front view of a portion of a LGA cartridge structure in a compressed state, according to embodiments of the invention.
Figure 4:
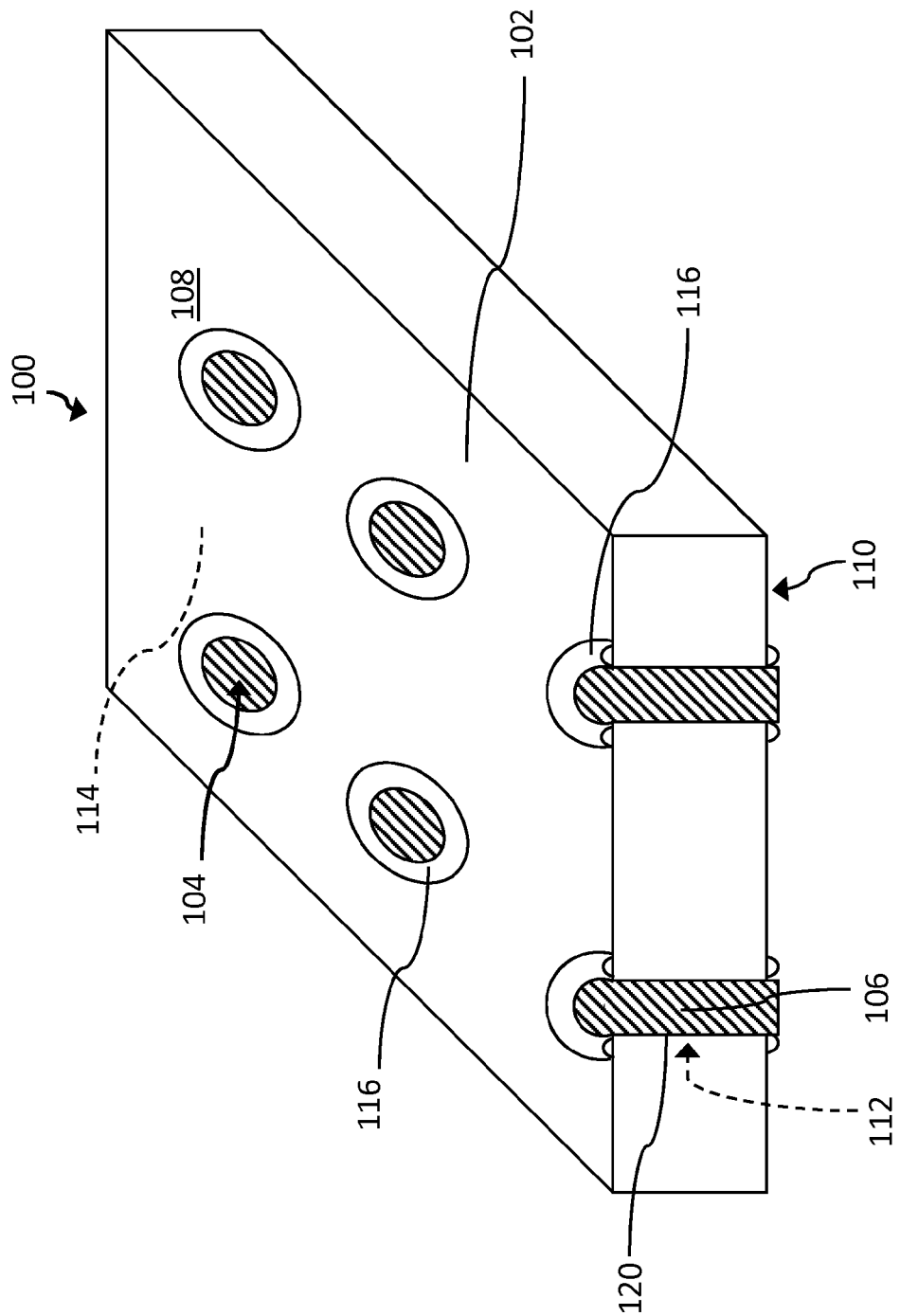
FIG. 4 shows a perspective view of a portion of the LGA cartridge structure in the compressed state as shown in FIG. 3, according to embodiments of the invention.

Turning to FIGS. 3 and 4, a portion of LGA cartridge structure 100 is shown in a compressed state according to embodiments of the invention. In various embodiments, as shown in FIGS. 3 and 4, the plurality of raised areas 114 (FIGS. 1 and 2) of deformable thin film 102 are substantially planar in the compressed state of deformable thin film 102. More specifically, as deformable thin film 102 is compressed, the substantially deformable raised areas 114 may be substantially compressed, such that first surface 108 and second surface 110 of deformable thin film 102 may be substantially planar.

Also as shown in FIGS. 3 and 4, in the compressed state of deformable thin film 102, substantially liquid metal 106 of deformable thin film 102 may extend to first surface 108 and second surface 110 of deformable thin film 102. More specifically, as shown in FIGS. 3 and 4, in a compressed state, enlarged portion 112 of the at least one aperture 104 may be deformed to become substantially planar with the side walls 120 of the at least one aperture 104, which may result in substantially liquid metal 106 being compressed between side walls 120. As substantially liquid metal 106 is compressed between sidewalls 120, substantially liquid metal 106 may be forced toward first surface 108 and second surface 110. As shown in FIGS. 3 and 4, in a compressed state substantially rigid structure 116 may not be deformed and may surround aperture 104 in a similar fashion as in the uncompressed state (FIGS. 1 and 2). As a result of the non-deformation of substantially rigid structure 116 in the compressed state, a portion of substantially liquid metal 106 that may flow out of opening 118 (FIG. 1) of aperture 104 and may be maintained within substantially rigid structure 116. That is, substantially rigid structure 116 may prevent substantially liquid metal 106 from flowing out of aperture 104 and substantially covering first surface 108 and/or second surface 110 of deformable thin film 102. As discussed herein, by maintaining the portion of substantially liquid metal 106 within substantially rigid structure on first surface 108 and/or second surface 110 of deformable thin film 102, the portion of substantially liquid metal 106 may form an ideal electro-mechanical coupling surface for electro-mechanically coupling a carrier and a socket base (FIGS. 5 and 6) via LGA cartridge structure 100.

As shown in FIGS. 1-4, substantially liquid metal 106 may be in a liquid state when positioned within the at least one aperture 104 of deformable thin film 102 of LGA cartridge structure 100. More specifically, substantially liquid metal 106 may be in a liquid state within an operating temperature range of deformable thin film 102 of LGA cartridge structure 100 in the compressed state. By maintaining substantially liquid metal 106 in a liquid state during the compressed state of deformable thin film 102, substantially liquid metal 106 may flow to first surface 108 and second surface 110 more easily as enlarged surface 112 of aperture 104 is deformed to be substantially planar with side walls 120. Substantially liquid metal 106 may be selected from a group consisting of mercury (Hg), and gallium (Ga). In alternative embodiment, substantially liquid metal 106 may be selected from a material that may include similar electrical conductive properties as mercury or gallium. Additionally, substantially liquid metal 106 may be selected from a material that may also be maintained in a liquid state within an operating temperature range of deformable thin film 102 in the compressed state. In an embodiment, the operating temperature range of deformable thin film 102 of LGA cartridge structure 100 may be approximately between approximately 0 degrees Celsius and approximately 100 degrees Celsius.

Turning to FIGS. 5 and 6, a portion of a LGA socket structure 200 in a compressed state is shown according to various embodiments of the invention. As shown in FIGS. 5 and 6, LGA socket structure 200 may include a socket base 202 including a first set of LGA contacts 204 on a first surface 206 of socket base 202. Socket base 202 may be electro-mechanically coupled to a circuit board (not shown). First set of LGA contacts 204 of socket base 202 may include any conventional electrically conductive material including, but not limited to, copper (Cu), gold (Au), aluminum (Al), and silver (Ag).

As shown in FIGS. 5 and 6, LGA socket structure 200 may also include LGA cartridge structure 100 positioned over first surface 206 of socket base 202. More specifically, as shown in FIG. 5, second surface 110 of deformable thin film 102 of LGA cartridge structure 100 may be positioned adjacent first surface 206 of socket base 202. LGA cartridge structure 100 may include deformable thin film 102 which may include at least one aperture 104 configured to hold substantially liquid metal 106. LGA cartridge structure 100, as shown in FIGS. 5 and 6 may be substantially similar to LGA cartridge structure 100 as described with reference to FIGS. 1-4. It is understood that similarly number components of LGA cartridge structure 100 as shown in FIGS. 5 and 6 may function in a substantially similar fashion. As such, redundant explanation of the components of LGA cartridge structure 100 is omitted for clarity. In various embodiments, as shown in FIG. 5, a portion of substantially liquid metal 106 extending adjacent second surface 110 of deformable thin film 102 of LGA cartridge structure 100 may be electro-mechanically coupled to first set of LGA contacts 204 of socket base 202.

Also shown in FIGS. 5 and 6, LGA socket structure 200 may also include a carrier 208 positioned over deformable thin film 102 of LGA cartridge structure 100. More specifically, as shown in FIG. 5, first surface 108 of deformable thin film 102 of LGA cartridge structure 100 may be positioned adjacent first surface 212 of carrier 208. As shown in FIGS. 5 and 6, carrier 208 may include a second set of LGA contacts 210 on a first surface 212 of carrier 208. As shown in FIG. 5, a portion of substantially liquid metal 106 extending adjacent first surface 108 of deformable thin film 102 of LGA cartridge structure 100 may be electro-mechanically coupled to second set of LGA contacts 210 of carrier 208. Second set of LGA contacts 210 of carrier 208 may include any conventional electrically conductive material including, but not limited to, copper (Cu) gold (Au), aluminum (Al), and silver (Ag). Carrier 208 may also include a microchip 214 coupled to a second surface 216 of carrier 208.

LGA socket structure 200, as shown in FIGS. 5 and 6, may also include a socket pressure plate 218 positioned over carrier 208. More specifically, as shown in FIG. 5, socket pressure plate 218 may be positioned over second surface 216 of carrier 208 for providing a compression force on carrier 208, LGA cartridge structure 100 and socket base 202, respectively. More specifically, socket pressure plate 218 may be configured to compress LGA cartridge structure 100 between socket base 202 and carrier 208. Additionally, by compressing LGA cartridge structure 100, socket pressure plate 218 may electro-mechanically couple carrier 208 to socket base 202 using substantially liquid metal 106. More specifically, by socket pressure plate 218 compressing LGA cartridge structure 100, substantially liquid metal 106 may flow to first surface 108 and second surface 110 of deformable thin film 102, and may electro-mechanically contact first set of LGA contacts 204 on socket base 202 and second set of LGA contacts 210 on carrier 208. By electro-mechanically coupling carrier 208 and socket base 202 via substantially liquid metal 106 of LGA cartridge structure 100, an electrical connection may be formed between microchip 214 mounted on carrier 208 and circuit board (not shown) coupled to socket base 202.

As shown in FIG. 6, LGA socket structure 200 may also include an alignment assembly 219 for aligning LGA cartridge structure 100 within LGA socket structure 200. More specifically, as shown in FIG. 6, LGA socket structure 200 may include an alignment opening 220 extending through a section, for example, a corner, of LGA cartridge structure 100. That is, LGA cartridge structure 100 may include a plurality of alignment openings 220, each alignment opening 220 positioned in a respective corner of LGA cartridge structure 100. Alignment assembly 219, as shown in FIG. 6, may also include an alignment pin 222 positioned on one of socket base 202, or socket pressure plate 218, in alignment with alignment opening 220 of LGA cartridge structure 100. That is, alignment pin 222 of socket base 202 and/or carrier 208 may be in alignment with, and in a compressed state, may be positioned within alignment opening 220 to align LGA cartridge structure 100 within LGA socket structure 200. LGA cartridge structure 100 may be aligned within LGA socket structure 200 by aligning substantially liquid metal 106 of LGA cartridge structure 100 with first set of LGA contacts 204 of socket base 202 and second sect of LGA contacts 210 of carrier 208 to provide an electro-mechanical coupling. As shown in FIG. 6, alignment pin 222 of socket base 202 may include a length substantially equal to the length of alignment opening 220 of LGA cartridge structure 100. In an alternative embodiment, alignment pin 222 of socket base 202 and alignment pin 222 of carrier 208 (shown in phantom) may include a combined length that is substantially equal to the length of alignment opening 220 of LGA cartridge structure 100.

Although alignment assembly 219 is shown as being positioned at the corners of the structures (e.g., LGA cartridge structure 100, socket base 202) of LGA socket structure 200, it is understood that alignment assembly 219 may be positioned in alternative locations of LGA socket structure 200. More specifically, alignment assembly 219 may also be positioned substantially in the center of each side of the structures (e.g., LGA cartridge structure 100, socket base 202) of LGA socket structure 200, or may be positioned between the electro-mechanical coupling structures (e.g., substantially liquid metal 106, first set of LGA contacts 204, etc.) of LGA socket structure 200.

Figure 7:
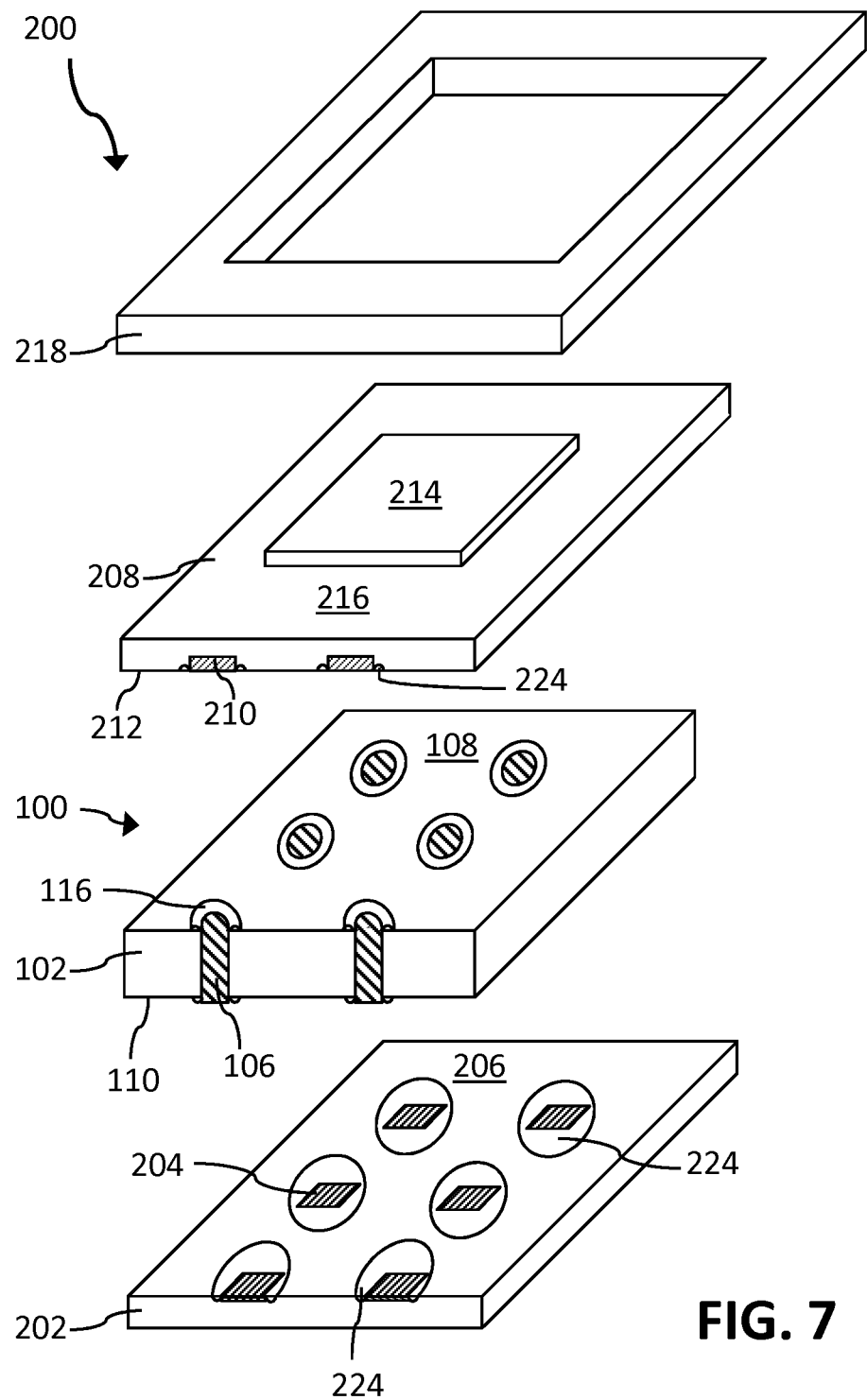
FIG. 7 shows an exploded perspective view of a portion of a LGA socket structure in a compressed state, according to an alternative embodiment of the invention.

Turning to FIG. 7, an exploded perspective view of a portion of LGA socket structure 200 in a compressed state is shown according to an alternative embodiment of the invention. As shown in FIG. 7, socket base 202 and/or carrier 208 may include an alignment recess structure 224 positioned in alignment with substantially rigid structure 116 on first surface 108 and second surface 110 of LGA cartridge structure 100. As similarly discussed herein with respect to alignment assembly 219 (FIG. 6), alignment recess structure 224 may aid in aligning LGA cartridge structure 100 within LGA socket structure 200. More specifically, alignment recess structure 224 may include a complementary shape to the shape of substantially rigid structure 116 of LGA cartridge structure 100, such that substantially rigid structure 116 may be positioned within alignment recess structure 224 during a compressed state. As similarly discussed herein, by positioning substantially rigid structure 116 within alignment recess structure 224 during a compressed state, substantially liquid metal 106 of LGA cartridge structure 100 may be aided in ensuring an electro-mechanically coupling between socket base 202 and carrier 208. That is, alignment recess structure 224 may aid in aligning substantially liquid metal 106 of LGA cartridge structure 100 with first set of LGA contacts 204 and second set of LGA contacts 210 in order to electro-mechanically couple socket base 202 and carrier 208.

Returning to FIG. 1, a method of forming LGA cartridge structure 100 is now discussed. A method of forming LGA cartridge structure 100 may include providing deformable thin film 102 having first surface 108 and second surface 110. As discussed herein, deformable thin film 102 may be formed by any conventional casting technique, including, injection molding, die casting, forming or machining. In addition to providing deformable thin film 102, the method of forming LGA cartridge structure 100 may include forming the plurality of raised areas 114 on first surface 108 and second surface 110 of deformable thin film 102. More specifically, the plurality of raised areas 114 may be formed on deformable thin film 102 during the same casting technique used to form deformable thin film 102, as discussed herein.

After providing deformable thin film 102, the method of forming LGA cartridge structure 100 may include forming at least one aperture 104 within deformable thin film 102 through first surface 108 and second surface 110. As discussed herein, at least one aperture 104 formed within deformable thin film 102 may be configured to hold substantially liquid metal 106 within aperture 104. At least one aperture 104 may be formed in deformable thin film 102 by any conventional material removal technique including, but not limited to, drilling, milling, or electrical discharge machining (EDM). Additionally, the method of forming LGA cartridge structure 100 may also include forming enlarged portion 112 in at least one aperture 104 for holding substantially liquid metal 106. More specifically, after at least one aperture 104 is formed within deformable thin film 102, enlarged portion 112 may be formed within at least one aperture 104 substantially between first surface 108 and second surface 110 of deformable thin film 102. Similar to the formation of at least one aperture 104 as discussed herein, enlarged portion 112 may be formed by any conventional material removal technique including, but not limited to, drilling, milling, or electrical discharge machining (EDM).

After the forming process of at least one aperture 104, the method of forming LGA cartridge structure 100 may include forming at least one substantially rigid structure 116 on first surface 108 and second surface 110 of deformable thin film 102. More specifically, substantially rigid structure 116 may be formed on first surface 108 and second surface 110 of deformable thin film 102, and may substantially surround each of the at least one apertures 104 formed within deformable thin film 102. Substantially rigid structure 116 may be formed on deformable thin film 102 by any conventional mechanical coupling technique including, but not limited to, welding, mechanical fastening, or adhesion. In alternative embodiment (not shown), substantially rigid structure 116 may be formed or cast (e.g., injection molded) as a single component with deformable thin film 102. More specifically, in an alternative embodiment (not shown), substantially rigid structure 116 may be formed on deformable thin film 102 during the initially casting technique for forming deformable thin film 102 of LGA cartridge structure 100.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A land grid array (LGA) cartridge structure comprising:
a deformable thin film having at least one aperture configured to hold a substantially liquid metal, whereby in a compressed state of the deformable thin film, the substantially liquid metal of the deformable thin film is configured to electro-mechanically couple a carrier and a socket base; and
at least one substantially rigid structure surrounding the at least one aperture of the deformable thin film,
wherein the substantially rigid structure is formed on at least one surface of the deformable thin film, wherein a first surface and a second surface of the deformable thin film include a plurality of raised areas positioned adjacent the at least one aperture in an uncompressed state of the deformable thin film and wherein the plurality of raised areas of the deformable thin film are substantially planar in the compressed state of the deformable thin film.

2. The structure of claim 1, wherein the at least one aperture includes an enlarged portion configured to hold the substantially liquid metal in the uncompressed state of the deformable thin film.

3. The structure of claim 1, wherein the substantially liquid metal of the deformable thin film extends to the first surface and the second surface of the deformable thin film in the compressed state of the deformable thin film.

4. The structure of claim 1, wherein the substantially liquid metal is in a liquid state within an operating temperature range of the deformable thin film in the compressed state.

5. The structure of claim 1, wherein the substantially liquid metal is mercury (Hg).

6. A land grid array (LGA) socket structure comprising:
a socket base including a first set of LGA contacts on a first surface of the socket base;
an LGA cartridge positioned over the first surface of the socket base, the LGA cartridge including a deformable thin film having at least one aperture configured to hold a substantially liquid metal;
a carrier positioned over the deformable thin film of the LGA cartridge, the carrier including a second set of LGA contacts on a first surface of the carrier; and
a socket pressure plate positioned over the carrier, the socket pressure plate configured to compress the LGA cartridge between the socket base and the carrier and electro-mechanically couple the carrier and the socket base using the substantially liquid metal during a compressed state of the LGA cartridge,
wherein a first surface and a second surface of the deformable thin film includes a plurality of raised areas positioned adjacent the at least one aperture in an uncompressed state of the LGA cartridge,
wherein the substantially liquid metal of the deformable thin film extends to the first surface and the second surface of the deformable thin film in the compressed state of the LGA cartridge for contacting the first set of LGA contacts of the socket base and the second set of LGA contacts of the carrier,
wherein the plurality of raised areas of the deformable thin film are substantially planar in the compressed state of the LGA cartridge.

7. The LGA socket structure of claim 6, wherein the substantially liquid metal of the LGA cartridge is in a liquid state within an operating temperature range of the LGA cartridge in the compressed state.

8. The LGA socket structure of claim 6, wherein the substantially liquid metal of the LGA cartridge is mercury (Hg).

9. The LGA socket structure of claim 6, wherein the at least one aperture includes an enlarged portion configured to hold the substantially liquid metal in the uncompressed state of the LGA cartridge.

10. The LGA socket structure of claim 9, further comprising:
at least one substantially rigid structure surrounding the at least one aperture of the deformable thin film,
wherein the substantially rigid structure is formed on at least one surface of the deformable thin film.

* * * * *